United States Patent
Wallberg et al.

(10) Patent No.: US 6,473,478 B1
(45) Date of Patent: Oct. 29, 2002

(54) DIGITAL PHASE-LOCKED LOOP WITH PHASE OPTIMAL FREQUENCY ESTIMATION

(75) Inventors: John L. Wallberg, Dallas, TX (US); Shawn A. Fahrenbruch, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/221,533

(22) Filed: Dec. 28, 1998

Related U.S. Application Data

(60) Provisional application No. 60/085,504, filed on May 14, 1998.

(51) Int. Cl.[7] .................................................. H03D 3/24
(52) U.S. Cl. ........................................ 375/376; 327/156
(58) Field of Search .................................. 375/327, 354, 375/373, 374, 376; 327/147, 156, 157, 159, 160; 331/2, 17; 360/57

(56) References Cited

U.S. PATENT DOCUMENTS

| | | | | |
|---|---|---|---|---|
| 4,745,372 A | * | 5/1988 | Miwa | 331/8 |
| 4,829,391 A | * | 5/1989 | Vargas et al. | 360/51 |
| 5,285,483 A | * | 2/1994 | Ogawa et al. | 375/376 |
| 5,511,100 A | * | 4/1996 | Lundberg et al. | 375/376 |
| 5,534,822 A | * | 7/1996 | Taniguchi et al. | 331/2 |
| 5,731,723 A | * | 3/1998 | Chen | 327/157 |
| 5,832,048 A | * | 11/1998 | Woodman, Jr. | 375/376 |
| 6,076,922 A | * | 6/2000 | Knierim | 347/103 |
| 6,265,947 B1 | * | 7/2001 | Iemmer et al. | 331/17 |

* cited by examiner

Primary Examiner—Stephen Chin
Assistant Examiner—Chieh M. Fan
(74) Attorney, Agent, or Firm—Robert N. Roundtree; Wade James Brady, III; Frederick J. Telecky, Jr.

(57) ABSTRACT

A circuit is designed with a register circuit (70) arranged to store a control word. A voltage-controlled oscillator (73) is coupled to receive the control word (72) and produce a clock signal (76) having a current frequency corresponding to the control word. A phase detector circuit (53) is coupled to receive a reference signal (52) and the clock signal. The clock signal has one of a phase lead and a phase lag with respect to the reference signal. The phase detector circuit produces a phase signal (58) having a first state in response to the phase lead and having a second state in response to the phase lag. An estimate circuit (69) is coupled to the register circuit and the phase detector circuit. The estimate circuit produces a next control word (71) corresponding to a next frequency intermediate the current frequency and a frequency corresponding to a transition between the first and second states.

31 Claims, 11 Drawing Sheets

DIGITAL PHASE-LOCKED LOOP WITH PHASE OPTIMAL FREQUENCY ESTIMATION

CLAIM TO PRIORITY OF PROVISIONAL APPLICATION

This application claims priority under 35 U.S.C. § 119(e)(1) of provisional application number 60/085,504, filed May 5, 1998.

FIELD OF THE INVENTION

This invention relates to a read channel for a hard disk drive and more particularly to a digital phase-locked loop with phase optimal frequency estimation.

BACKGROUND OF THE INVENTION

Present computer systems typically use hard-disk drive (HDD) systems for mass storage due to their low cost, nonvolatile storage and high capacity. Advances in technology constantly demand improved access times for these HDD systems. Much of the access time limitation is due to a read channel circuit that serves as the physical connection between the HDD and a computer system. Read channel circuits of the prior art frequently employed BiCMOS technology to achieve required access times. The cost and process complexity of these BiCMOS circuits, however, make them an undesirable solution.

These problems with HDD systems are best understood with reference to the physical hard disk of FIG. 1. The disk is divided into a series of concentric tracks. These tracks may have a density of 5000 to 7000 tracks per inch (TPI). The tracks are arranged in approximately 12 groups or zones of adjacent tracks. Tracks in each zone are written at the same frequency. Since the disk rotates at a constant speed, tracks in the outer zone, for example, are written at a higher frequency than tracks in the inner zone, thereby maintaining a uniform and efficient data density for the entire disk. Each track is divided into data sectors of typically 512 bytes. The tracks are further divided into pie-shaped slices referred to as servo wedges. There are typically 50 to 100 servo wedges in each track. These servo wedges contain control information and are typically written at the same frequency without regard to the track zone.

A HDD read channel operates in read, write and servo modes. The servo mode provides the disk controller with information concerning track number and the magnetic head position on a track. The write loop or synthesizing loop must synthesize different frequencies with reference to a known frequency, typically provided by a crystal oscillator, for the different zones of the HDD. These frequencies are typically synthesized by dividing the reference frequency by M and a variable frequency oscillator (VFO) frequency by N. This VFO is often referred to as a voltage controlled oscillator (VCO). Thus, various ratios of N/M create desired frequencies. A typical analog phase-locked loop (PLL) of the prior art that may be used to synthesize these frequencies is shown in FIG. 2. The PLL includes a phase detector 11, a loop filter 13 and a VFO or VCO 15. This analog PLL, particularly the loop filter, requires considerable circuit area for analog components including capacitors and resistors. Moreover, steady-state power consumption of these analog circuits increases with decreasing response times.

SUMMARY OF THE INVENTION

These problems are resolved by a circuit comprising a register circuit that is arranged to store a control word. A variable frequency oscillator is coupled to receive the control word and produce a clock signal having a current frequency corresponding to the control word. A phase detector is coupled to receive a reference signal and the clock signal. The clock signal has one of a phase lead and a phase lag with respect to the reference signal. The phase detector produces a phase signal having a first state in response to the phase lead and having a second state in response to the phase lag. An estimate circuit is coupled to the register circuit and the phase detector circuit. The estimate circuit produces a next control word corresponding to a next frequency intermediate the current frequency and a frequency corresponding to a transition between the first and second states.

The present invention substantially improves PLL lock time. This improved lock time makes the all-digital approach feasible for time base generation for phase-locked loops.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

An important design criterion of the digital PLL of the present invention is to maintain a zero steady state phase error for all intended operating conditions. This is because the digital PLL, unlike an analog PLL, determines only the polarity and not the magnitude of a phase error. The error e(t), therefore, must approach zero as time approaches infinity. A corresponding result for the frequency domain is given by the Final Value Theorem of equation 1.

$$\lim_{s \to 0} s(E(s)) = \lim_{t \to \infty} e(t) \quad [1]$$

Figure 1:
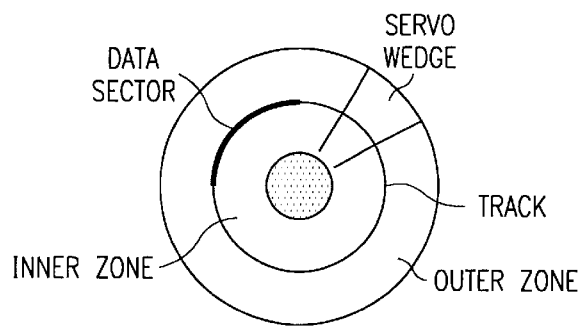
FIG. 1 is a block diagram of a typical hard disk of the prior art.
Figure 2:
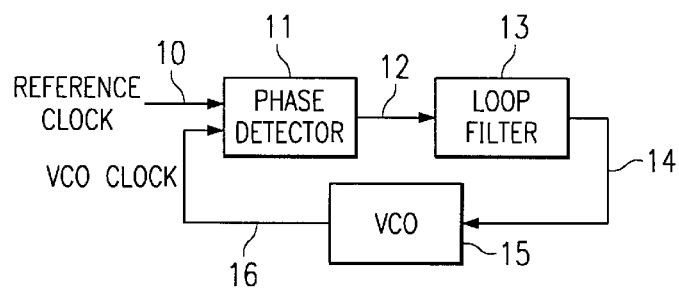
FIG. 2 is a block diagram of a typical PLL of the prior art.
Figure 3:
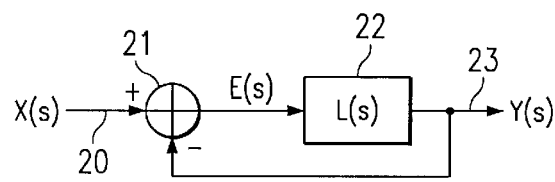
FIG. 3 is a frequency domain block diagram of a PLL.

Referring to FIG. 3, there is a frequency domain block diagram of a PLL. The frequency domain error divided by the input signal is readily derived from the diagram as given by equation 2.

$$\frac{E(s)}{X(s)} = \frac{1}{1 + L(s)} \quad [2]$$

The open loop transfer function L(s) is the total of the phase detector, the loop filter and the VFO or VCO. All input and output signals of the phase detector are in terms of phase. Thus, the phase detector only contributes a constant K to the open loop transfer function. The VCO exhibits a proportional relationship between voltage and frequency and, therefore, contributes an integrator. Adding another integrator for a loop filter and substituting into equation 2 yields equation 3.

$$\frac{E(s)}{X(s)} = \frac{s^2}{s^2 + K} \quad [3]$$

Application of the Final Value Theorem yields equation 4.

$$\lim_{t \to \infty} e(t) = \lim_{s \to 0} s(E(s)) = \lim_{s \to 0} s \left( \frac{1}{s^2} * \frac{s^2}{s^2 + K} \right) = \frac{0}{K} = 0 \quad [4]$$

Figure 4A:
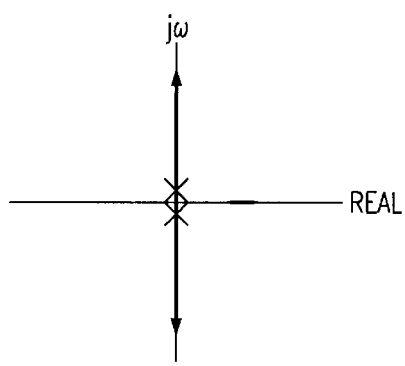
FIG. 4A–4B are root-locus plots of the open-loop transfer function of FIG. 3.
Figure 4B:
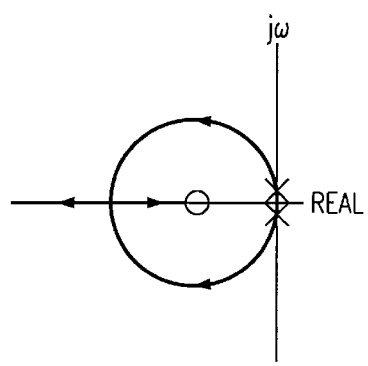

This satisfies the requirement for a zero steady-state error. The dual integrators of the open loop transfer function, however, produce two poles along the imaginary axis as shown in FIG. 4A. This condition renders the PLL oscillatory. This is resolved by the addition of a single zero in the left-half plane to move the two poles to the left of the imaginary axis as shown in FIG. 4B. This zero combined with the integrator is a proportional plus integral compensation scheme.

Figure 5:
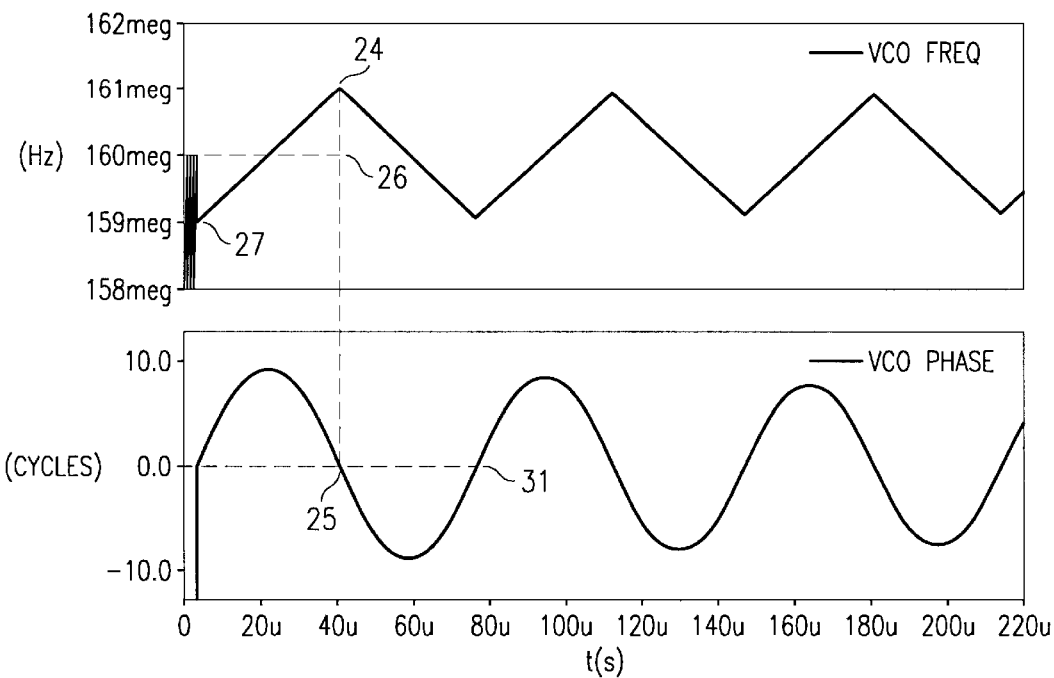
FIG. 5 is a loop response simulation without the phase estimator of the present invention.

A proportional compensation scheme is inherent in the phase detector decision to either increment or decrement VCO frequency with a phase lag or phase lead, respectively. The loop response simulation of FIG. 5 subject to an overdamped waveform, without the phase estimator of the present invention, will be used to explain the integral compensation scheme. The simulation includes a frequency diagram (above) and corresponding phase diagram. The phase diagram indicates the phase of the VCO clock signal with respect to a reference signal. In operation, the VCO of the digital PLL is initialized at a frequency that is close to an optimal frequency by one of several methods known to those of ordinary skill in the art as described by Jim Dunning et al., *An All-Digital Phase-Locked Loop with 50-Cycle Lock Time Suitable for High-Performance Microprocessors*, IEEE Journal of Solid State Circuits, vol. 30, no. 4, 412–422 (1995). After this coarse initialization, the digital PLL proceeds to fine tune the VCO frequency and achieve frequency and phase lock. This initial frequency is incremented over time for 40 microseconds. The phase polarity changes from positive to negative at point, thereby initiating a sequence of frequency decrements at 24. These frequency decrements continue for another 40 microseconds until the phase detector signals another phase reversal at point 31 and begins a corresponding sequence of frequency increments. This process continues for several cycles and eventually achieves frequency and phase lock. It is particularly significant, however, that each phase reversal occurs when the reference and VCO phases are aligned 25 at a time of the maximum frequency error 24. Thus, an optimal VCO frequency 26 is at an approximate midpoint between minimum 27 and maximum 24 frequency excursions and corresponds to a phase reversal 25.

Figure 6:
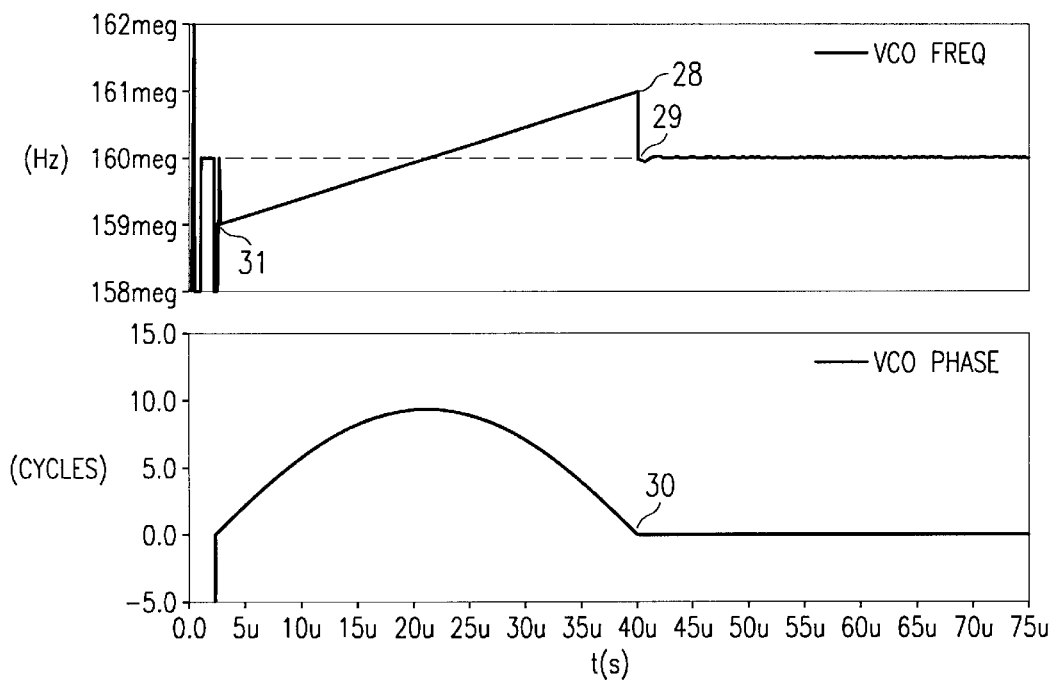
FIG. 6 is a loop response simulation with the phase estimator of the present invention.

Turning now to FIG. 6, a loop response simulation with the phase estimator of the present invention will be explained in detail. The VCO is initialized at a starting frequency as previously described. A digital control word determines the VCO frequency. This control word is incremented for 40 microseconds as the VCO frequency increases to point 28. A digital estimate word is initialized with the control word and incremented half as often as the control word. A phase reversal is detected at point 30 when the phase of the reference signal and the VCO are aligned. The estimate word is then substituted for the control word and the VCO frequency immediately changes to a frequency intermediate the minimum 31 and maximum 28 frequency excursions. This intermediate frequency is an approximate midpoint 29 between the minimum 31 and maximum 28 frequencies. This integral compensation scheme is repeated for subsequent estimates until the desired precision of frequency and phase lock are achieved. This scheme is highly advantageous in providing a precise estimate of a next VCO frequency while maintaining a current VCO frequency. Both frequencies are stored in respective estimate and current control words. Furthermore, this integral correction of the next VCO frequency provides a much faster phase lock than schemes of the prior art. Thus, circuit performance requirements are greatly diminished in view of this faster phase lock.

Figure 7:
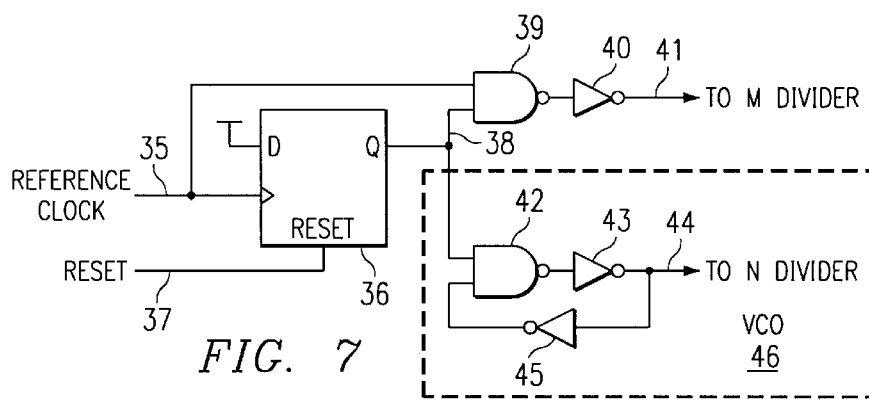
FIG. 7 is a circuit for aligning the VCO and reference clock.

Referring now to FIG. 7, there is a simplified circuit for initially aligning the VCO and reference clock. The circuit includes NAND gate 39 and inverter 40 for coupling the reference clock at lead 35 to a divide-by-M frequency divider circuit. The circuit further includes a simplified VCO ring counter for applying a clock signal to a divide-by-N circuit. Such ring counters are well understood by those having ordinary skill in the art to have an odd number of inversions with frequency controlled by preferably modulating gate conductivity with a control voltage (not shown).

In operation, the circuit is initialized by a reset signal on lead 37. This reset signal enables flip-flop 36. The flip-flop subsequently propagates a logical one from the Q output to each of NAND gates 39 and 42. This logical one enables both NAND gates simultaneously so that the reference clock signal and the VCO clock signal are applied to their respective frequency divider circuits at approximately the same time.

Figure 8:
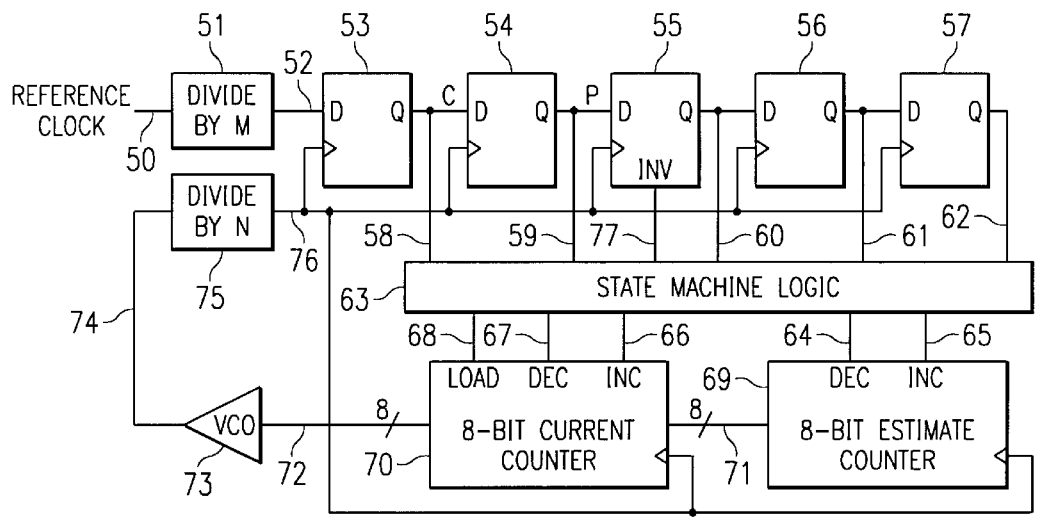
FIG. 8 is a block diagram of a digital PLL of the present invention.

Referring now to the block diagram of FIG. 8, a digital PLL of the present invention will be explained in detail. The circuit for initially aligning the VCO and reference clock signals of FIG. 7 is omitted for simplicity. The digital PLL includes a divide-by-M circuit for coupling the reference clock to a shift register including flip-flop circuits 53–57. Clock input terminals of the flip-flop circuits are coupled to the VCO via a divide-by-N circuit 75. Output terminals of the flip-flop circuits 58–62 are coupled to state machine logic circuit 63. The state machine logic circuit 63 is coupled to 8-bit counters 69 and 70. Counter 70 is coupled to the VCO circuit 73. The VCO circuit 73 preferably includes a digital-to-analog (DAC) converter for producing a voltage corresponding to a control word stored in counter 70.

Operation of the digital PLL will be described in detail with reference to the state diagram of FIG. 9 and the flow chart of FIG. 10. Integers N and M are chosen for dividers 75 and 51, respectively, so that the VCO circuit 73 will produce an optimal frequency corresponding to the ratio N/M for a specific zone of the hard disk when phase and frequency lock are achieved. The digital PLL counters 69–70 are initialized as previously described to respective control words corresponding to a VCO frequency that is near an optimal frequency. This starting VCO frequency divided by N is applied to clock input terminals of flip-flop circuits 53–57 and 8-bit counter circuits 69–70 to synchronize operation of the digital PLL. The reference clock applies a reference clock signal divided by M to the input terminal of flip-flop circuit 53 on lead 52. The logic state of this divided reference clock is loaded into flip-flop circuit 53 in response to the clock signal on lead 76 and produces the current phase signal on output lead 58. This current phase signal is a logical zero if the VCO clock signal at lead 76 precedes the reference clock signal at lead 52. Alternatively, current phase signal is a logical one if the VCO clock signal follows the reference clock signal at lead. Thus, flip-flop circuit 53 acts as digital phase detector. The next cycle of the VCO clock signal on lead 76 shifts the contents of flip-flop circuit 53 into flip-flop circuit 54 and shifts a new phase signal into on lead 52 into flip-flop circuit 53. This new signal or phase sample becomes the current value C and the content of flip-flop circuit 54 at lead 59 becomes the previous value P.

Figure 9:
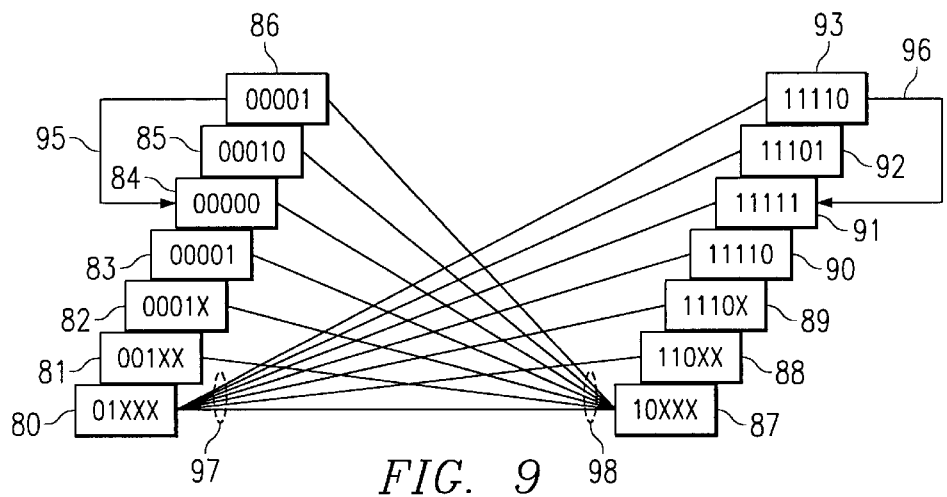
FIG. 9 is a state diagram of the digital PLL of FIG. 8.

Referring now to FIG. 9, the current and previous samples represent, for example, the respective 10 values of state 87. The XXX values represent "don't care" values of flip-flop circuits 55–57. The state machine logic circuit 63 determines if the previous phase sample P at lead 59 is the same as the current phase sample C at lead 58 in decision block 101 (FIG. 10). Since they are different, the contents of estimate counter 69 are then transferred to current counter 70 on bus 71.

The control word in current counter 70 then applies this control word to bus 72 to control the VCO frequency. The next phase sample moves the state machine to block 88. This time the state machine logic circuit determines that the current C and previous P phase samples are the same at decision block 101. This sequence continues as new phase samples replace the current and previous values in response to the reference clock signal on lead 52 and the VCO clock signal on lead 76. The state machine moves from block 88 to 89 to 90 corresponding to decision blocks 101, 102 and 103, respectively, while there is no phase change. After five phase samples show no phase change following decision block 104, state block 91 has all logical ones. In response to this all-one state, the current counter 70 and estimate counter 69 are each incremented at block 110 (FIG. 10) in response to signals on leads 66 and 65, respectively, thereby increasing the frequency of the VCO.

The value of flip-flop circuit 55 is inverted by a state machine logic signal on lead 77 to function as a loop counter. After three more phase samples, the inverted value of flip-flop circuit 55 is shifted out of flip-flop circuit 57 and the state machine returns to state block 91 along path 96. The state machine then increments only the current counter at block 115 (FIG. 10) in response to the all-one state and again inverts the value of flip-flop circuit 55 via the signal on lead 77. After three more all-one phase samples, the state machine logic returns to state 91 (FIG. 9) and to block 110 (FIG. 10) along path 119 and increments the current and estimate counters.

This loop sequence continues while there is no phase change and the phase samples remain unchanged. The current counter is incremented at every pass through the 91–93, 96 state loop. The estimate counter, however, is incremented at every other pass through the 91–93, 96 state loop. This estimate counter, therefore, maintains a control word estimate that has a value intermediate and preferably half way between the present control word and the control word value at the previous phase change. This intermediate value is an integral error term between phase changes corresponding to minimum and maximum frequency error points. This is highly advantageous in correcting the VCO frequency and achieving rapid frequency and phase lock. Since the VCO frequency error is known at each state transition, no calculations are necessary to determine a new VCO frequency. Moreover, this new VCO frequency is a much more accurate prediction than incremental methods of the prior art. Thus, far fewer estimates are necessary to achieve frequency and phase lock according to the present invention.

The VCO frequency continues to increase in response to the incremented control word until a phase change is detected. This corresponds to the increasing VCO frequency of the simulation of FIG. 11 from point 120 to point 121. Eventually, one of decision blocks 111–113, 116–118 (FIG. 10) will determine that the current phase sample C is different from the previous phase sample P and return to block 108. This corresponds to a state transition along one of paths 97 to state 80 (FIG. 9). The state machine logic then loads the value of estimate counter 69 into current counter 70 via bus 71. Thus, the estimate control word is loaded and becomes the current control word applied to bus 72 in response to a load signal on lead 68. This new control word abruptly changes the VCO frequency to a nearly optimal value at point 122 (FIG. 11) at a time when the divided reference clock signal and the divided VCO clock signal are in phase. The previous value of the estimate control word remains as a starting value for a new estimate control word. If subsequent phase samples indicate the new divided VCO frequency leads the divided reference frequency, the state machine logic proceeds from state 80 to 81 to 82 and following in the previously described manner.

A subsequent phase change, however, would initiate a return along one of paths 98 to states 87 to 88 to 89 and following. Once frequency and phase lock are achieved, the state machine logic will typically oscillate between states 80 and 87 indicating a loop through decision block 101. This oscillation is preferably constrained to the least significant bit (LSB) of the control word to yield acceptable resolution of the optimal frequency.

Figure 11:
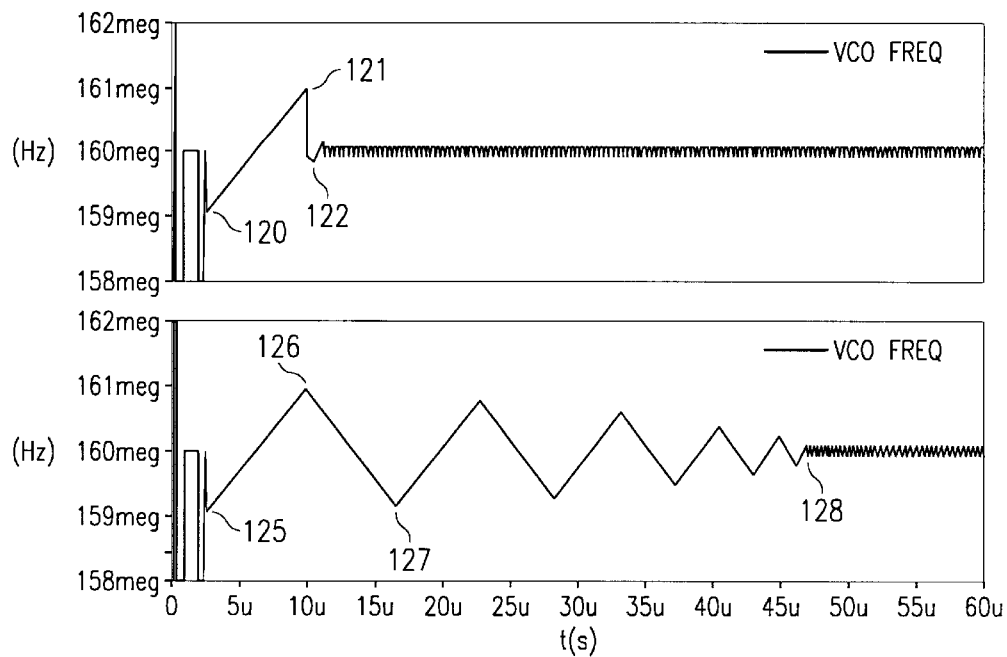
FIG. 11 illustrates the lock time of the digital PLL of the present invention with and without phase optimal frequency estimation.

The simulation of FIG. 11 illustrates the significant improvement in frequency and phase lock with and without phase optimal frequency estimation of the present invention. The upper simulation of the present invention makes an abrupt change to a nearly optimal VCO frequency on the first estimate with the transition from point 121 to point 122. Two subsequent estimates require substantially less time than the initial estimate due to the precision of the initial estimate. The phase optimal frequency estimation scheme of the present invention, therefore, achieves frequency and phase lock in 11 microseconds. By way of comparison, an incremental estimation without the present invention is shown in the lower simulation. Each successive estimate from point 125 to point 126 to point 127 provides an oscillatory convergence to an optimal frequency that eventually achieves frequency and phase lock at point 128 after 47 microseconds. Thus, the present invention improves frequency and phase lock by a factor of four over the oscillatory convergence method. This substantial improvement in acquisition time is accompanied by corresponding reductions in circuit cost, complexity and power.

The digital PLL of the present invention differs from analog systems in that a phase relationship is sampled rather than continuously monitored. Phase samples change, therefore, at a rate of the reference clock signal divided by M. These phase samples may change due to system noise or jitter. This jitter may affect the digital PLL differently in different parts of the system. A typical industry standard requirement for this digital PLL is ±3% absolute jitter. This is equivalent, for example, to ±75 picoseconds for a 400 MHz clock. A cumulative effect of jitter according to equation 5 is called wander. This wander error accumulates with each $n^{th}$ sample and may result in significant error over several cycles of system operation.

$$actual\_period = ideal\_period + jitter(n) - jitter(n-1) + wander(n) \quad [5]$$

Figure 12:
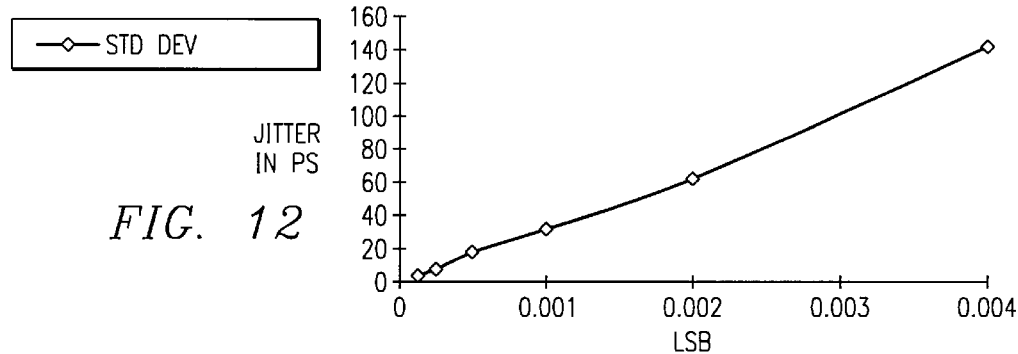
FIG. 12 is a simulation showing a decreasing standard deviation of jitter of the digital PLL with increasing LSB resolution.

Simulations of the present invention validate performance under high-noise conditions. The diagram of FIG. 12 is a simulation of jitter as a function of LSB resolution with clocks and frequency dividers held constant. Thus, the standard deviation of jitter decreases proportionally with increasing LSB resolution. This follows from the previously mentioned result that control word oscillation at frequency and phase lock is typically constrained to the LSB.

Figure 13:
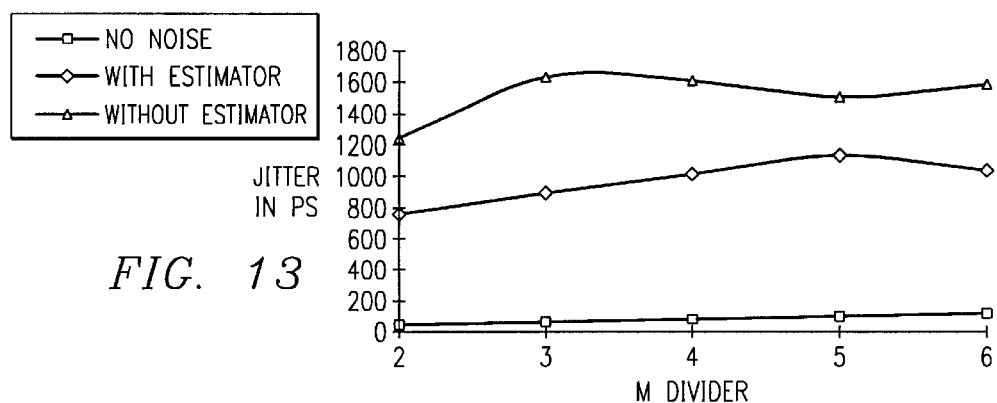
FIG. 13 is a simulation comparing the digital PLL with and without phase optimal frequency estimation for nonzero wander.

Referring now to FIG. 13, there is a simulation comparing the digital PLL with and without phase optimal frequency estimation for nonzero wander added to the VCO. The simulation shows a significant improvement in noise rejection with phase optimal frequency estimation for a variation of M and N frequency dividers holding the ratio N/M constant. This results from the relatively more precise estimate of phase optimal frequency estimation which quickly corrects the cumulative error due to wander.

Figure 14:
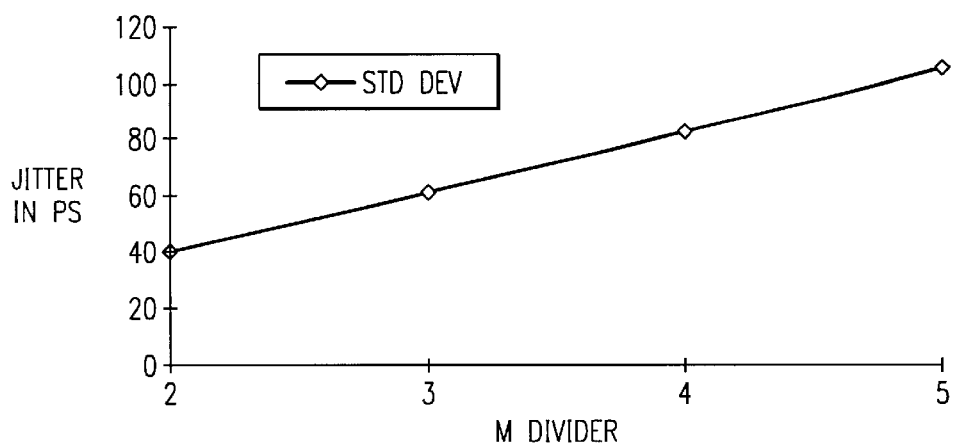
FIG. 14 is a simulation showing VCO jitter as a function of the M divider.
Figure 15:
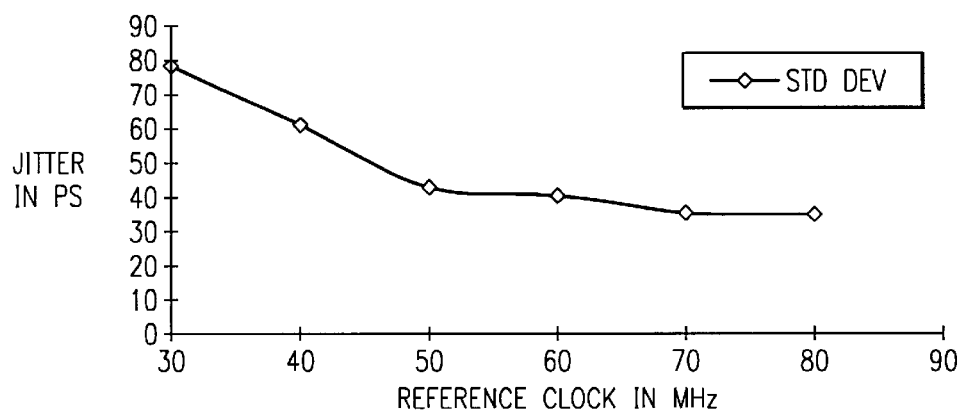
FIG. 15 is a simulation showing VCO jitter as a function of the reference clock frequency.

Turning now to FIG. 14, there is a simulation showing VCO jitter as a function of the M divider. The ratio of N/M is held constant as M and N are increased. The result shows a proportional increase in the standard deviation of jitter with increasing M. This is due to the fact that any increase in M decreases the sample rate of the reference clock divided by M. A similar result is seen in the simulation of FIG. 15 where increasing the frequency of the reference clock signal increases the sample rate of the digital PLL, thereby decreasing VCO jitter.

Figure 16:
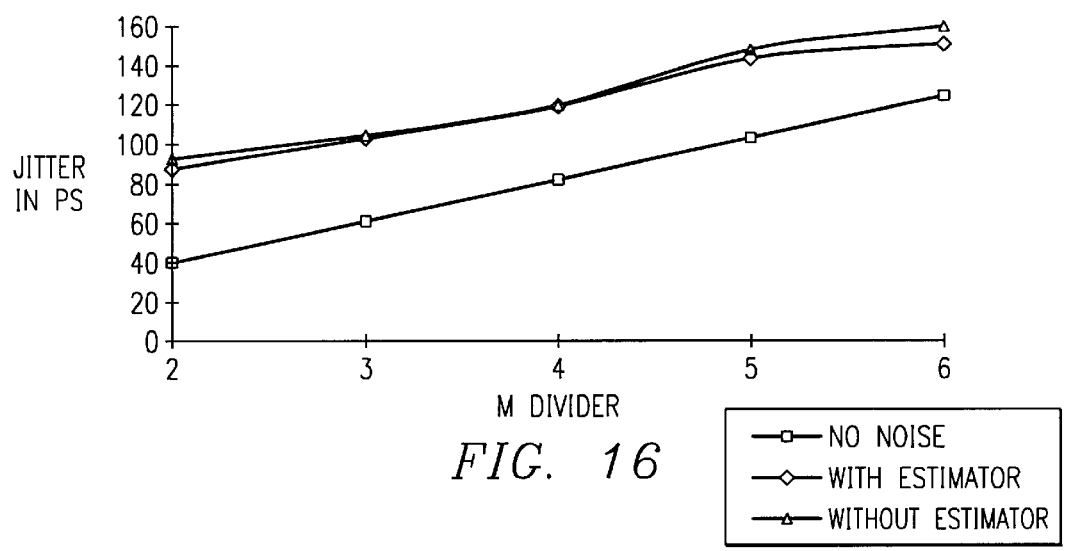
FIG. 16 is a simulation comparing the digital PLL with and without phase optimal frequency estimation for 100 ps of reference clock jitter.
Figure 17:
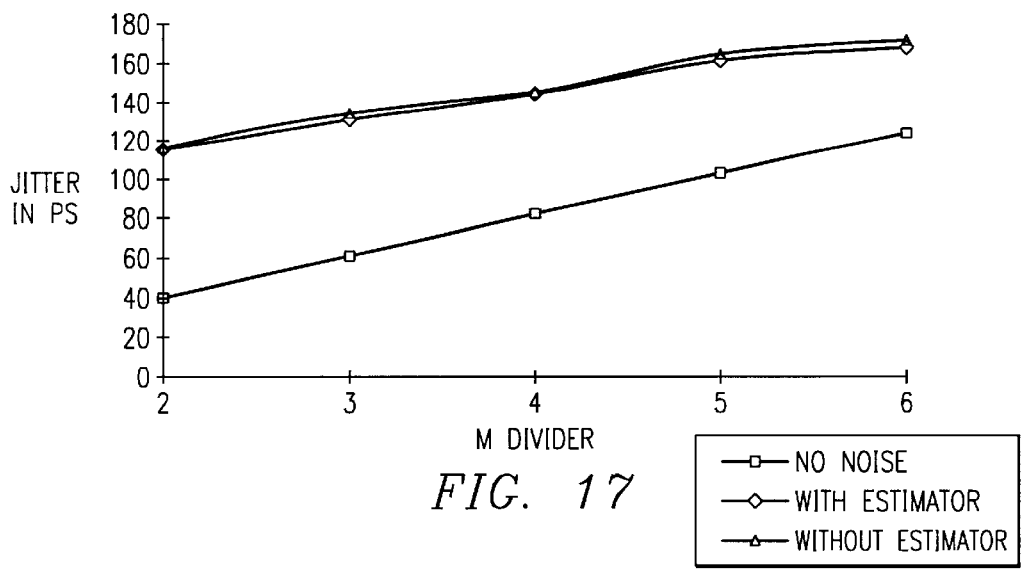
FIG. 17 is a simulation comparing the digital PLL with and without phase optimal frequency estimation for 100 ps of VCO jitter.

The simulations of FIGS. 16–17 show the effect of jitter on the reference clock and the VCO, respectively. Both indicate little difference with and without phase optimal frequency estimation for 100 ps of jitter. This is because the effect of jitter is not cumulative in either case according to equation 5.

Figure 18:
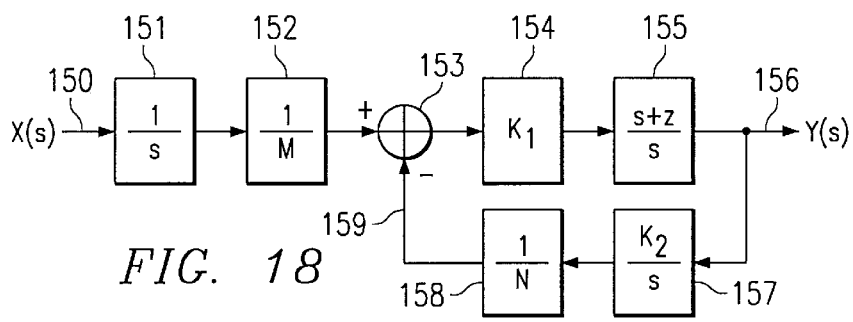
FIG. 18 is a frequency domain block diagram of the digital PLL of the present invention.

Referring now to FIG. 18, there is a frequency domain block diagram of the digital PLL of the present invention. This diagram will be used to explain the effect of tones on the digital PLL. Tones differ from noise in that they may alter the control word operating point. Thus, the control word must change to adjust for noise as well as a change in its operating point. A closed loop transfer function of the digital PLL is given in equation 6. The term $K_1$ is nonlinear and inversely proportional to phase error E(s) (FIG. 3).

$$\frac{Y(s)}{X(s)} = \frac{1}{s}\frac{1}{M}\frac{K_1\frac{(s+z)}{s}}{1+\frac{1}{N}\frac{K_2}{s}K_1\frac{(s+z)}{s}} = \frac{\frac{K_1}{M}(s+z)}{s^2 + \frac{K_1 K_2}{N}(s+z)} \quad [6]$$

At low frequencies the second order term in the denominator is not significant. The overall response is relatively constant, and the loop acts as a low-pass filter. At higher frequencies, however, the second order term becomes significant, and the digital PLL has a one-pole roll off.

Figure 19:
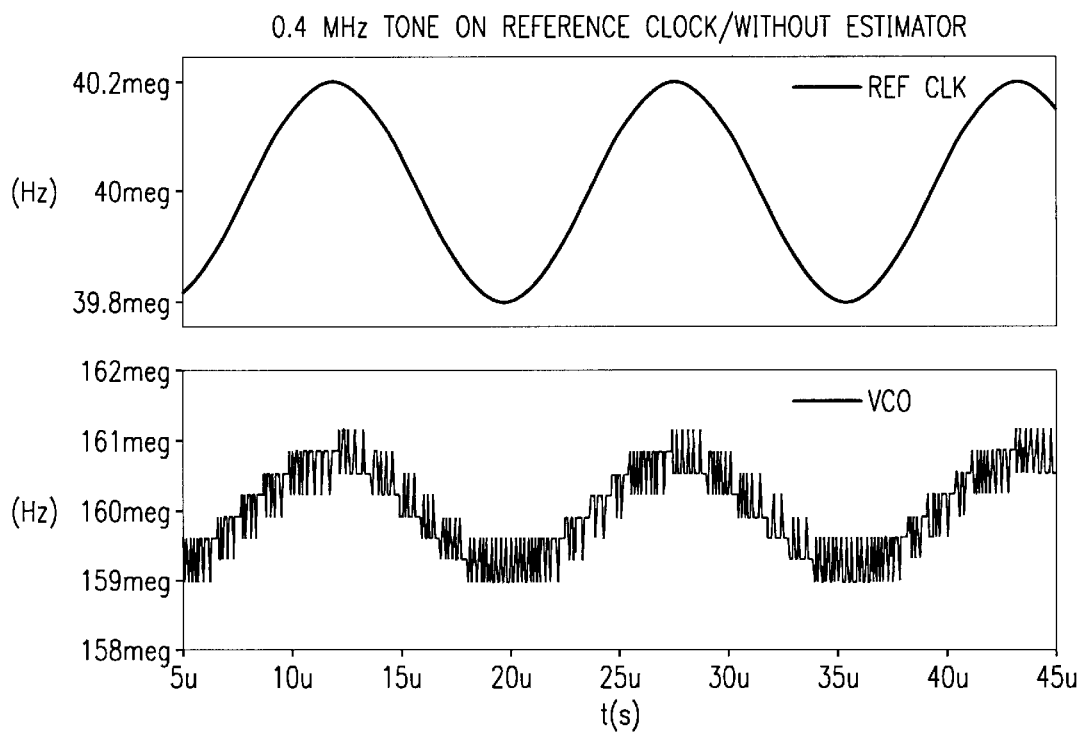
FIG. 19 is a simulation of the digital PLL without phase optimal frequency estimation having the reference clock modulated with a 0.4 MHz tone.
Figure 20:
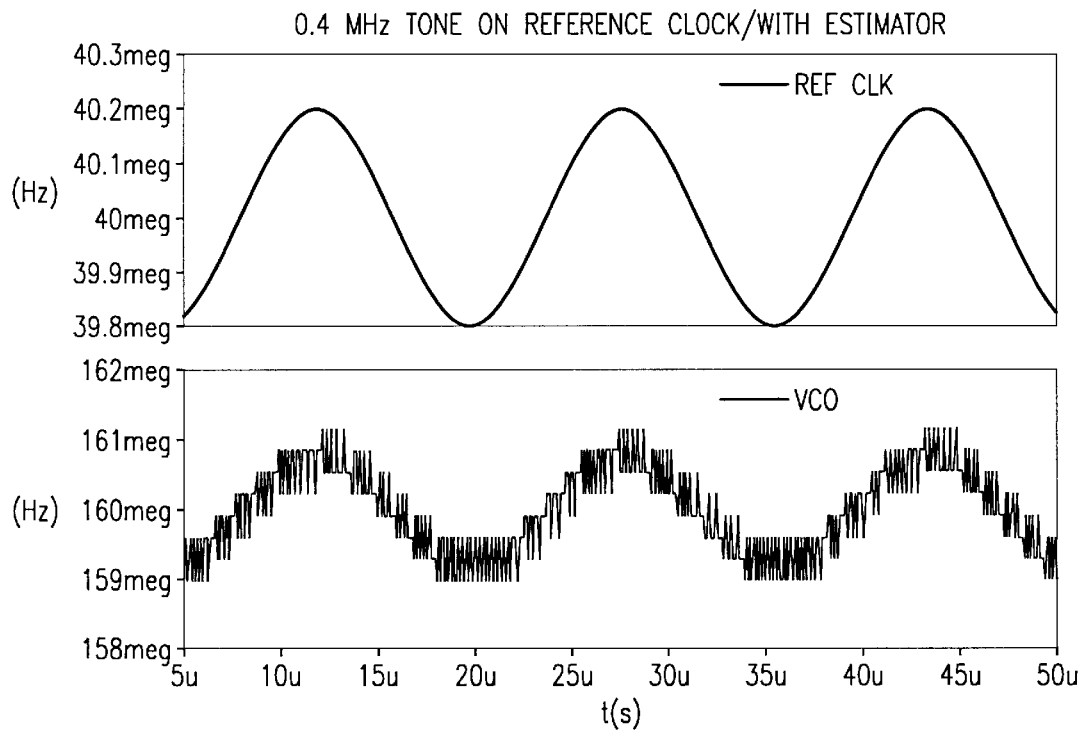
FIG. 20 is a simulation of the digital PLL with phase optimal frequency estimation having the reference clock modulated with a 0.4 MHz tone.
Figure 21:
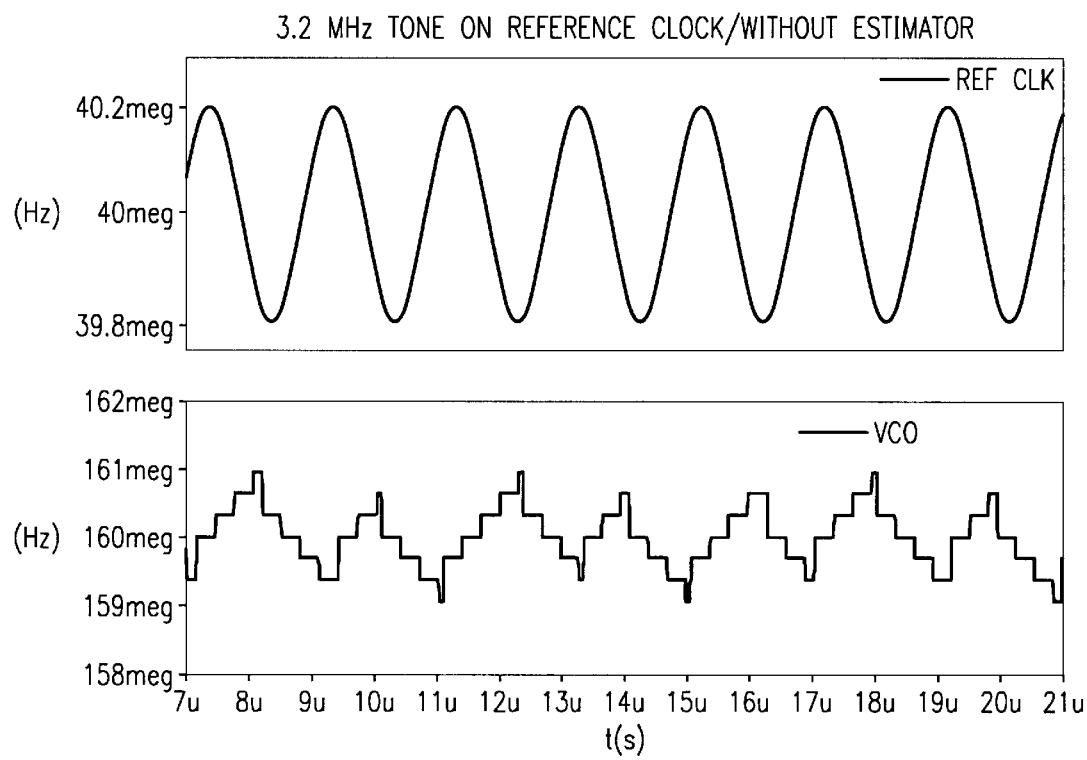
FIG. 21 is a simulation of the digital PLL without phase optimal frequency estimation having the reference clock modulated with a 3.2 MHz tone.
Figure 22:
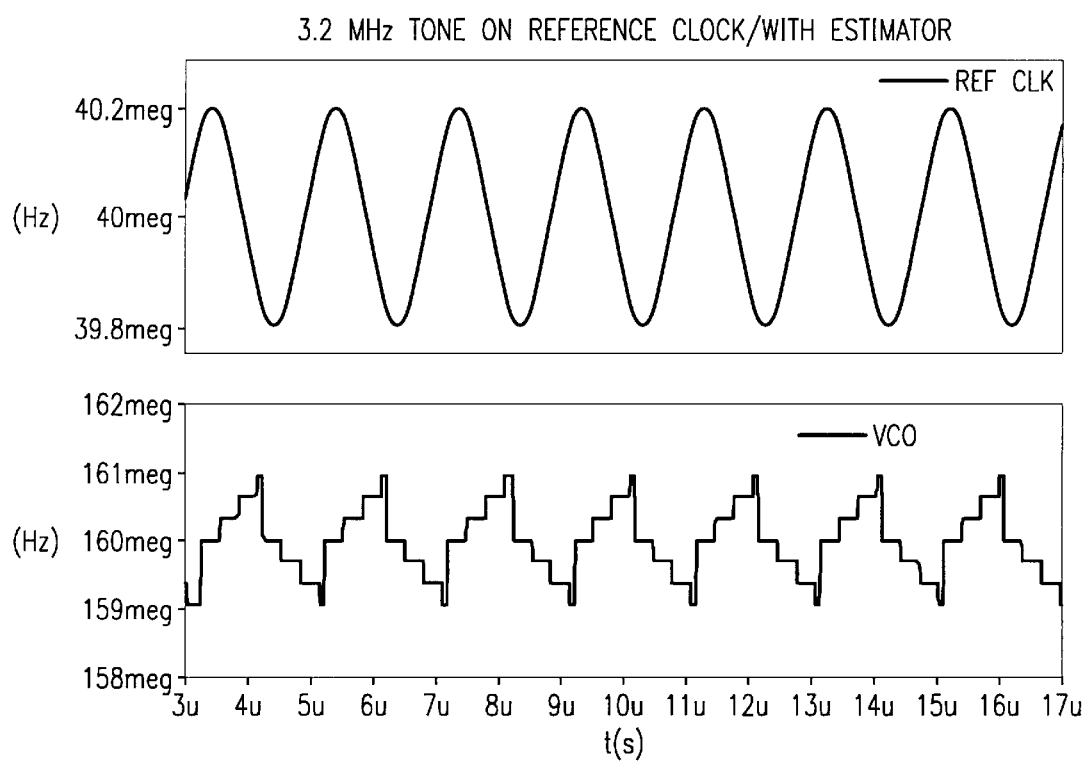
FIG. 22 is a simulation of the digital PLL with phase optimal frequency estimation having the reference clock modulated with a 3.2 MHz tone.

The simulations of FIG. 19 and FIG. 20 show the effect of a low frequency tone of 0.4 MHz on the reference clock without and with phase optimal frequency estimation, respectively. The VCO frequency in the lower curve of each figure easily tracks the tone as previously described. By way of comparison, the simulations of FIG. 21 and FIG. 22 show the effect of a relatively high frequency tone of 3.2 MHz on the reference clock. The VCO frequency in the lower curve of each figure is unable to track the high frequency tone on the reference clock and achieve frequency and phase lock.

Figure 23:
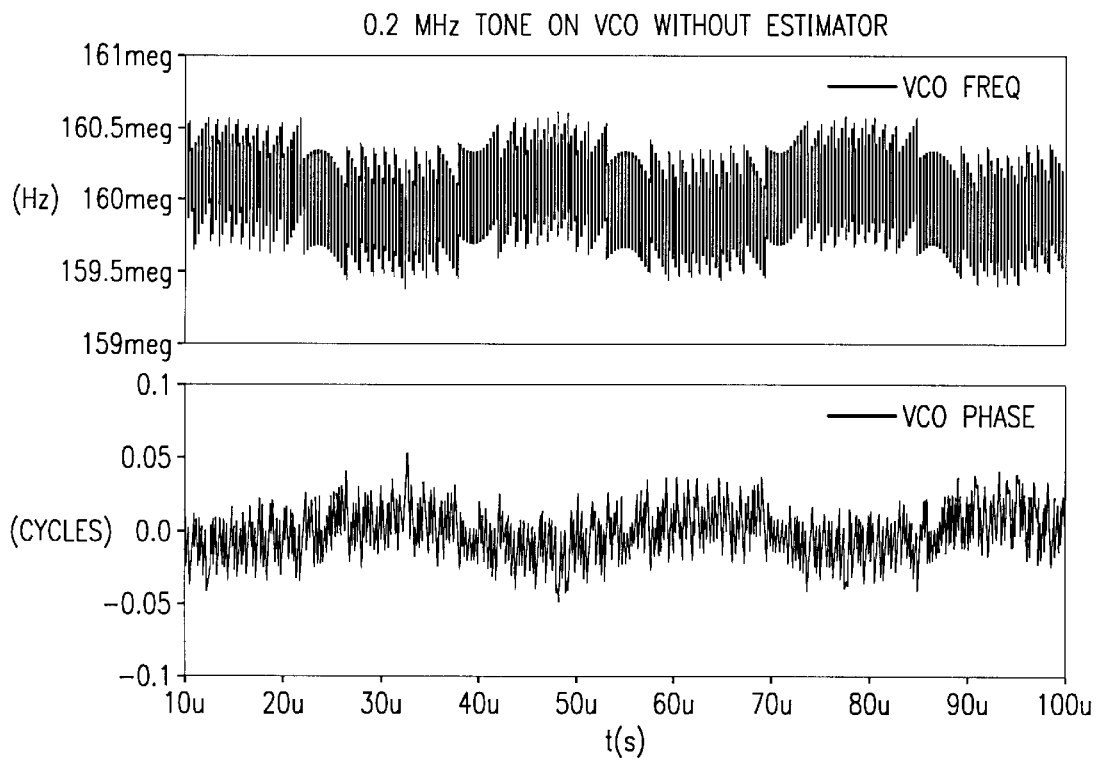
FIG. 23 is a simulation of the digital PLL without phase optimal frequency estimation having the VCO modulated with a 0.2 MHz tone.
Figure 24:
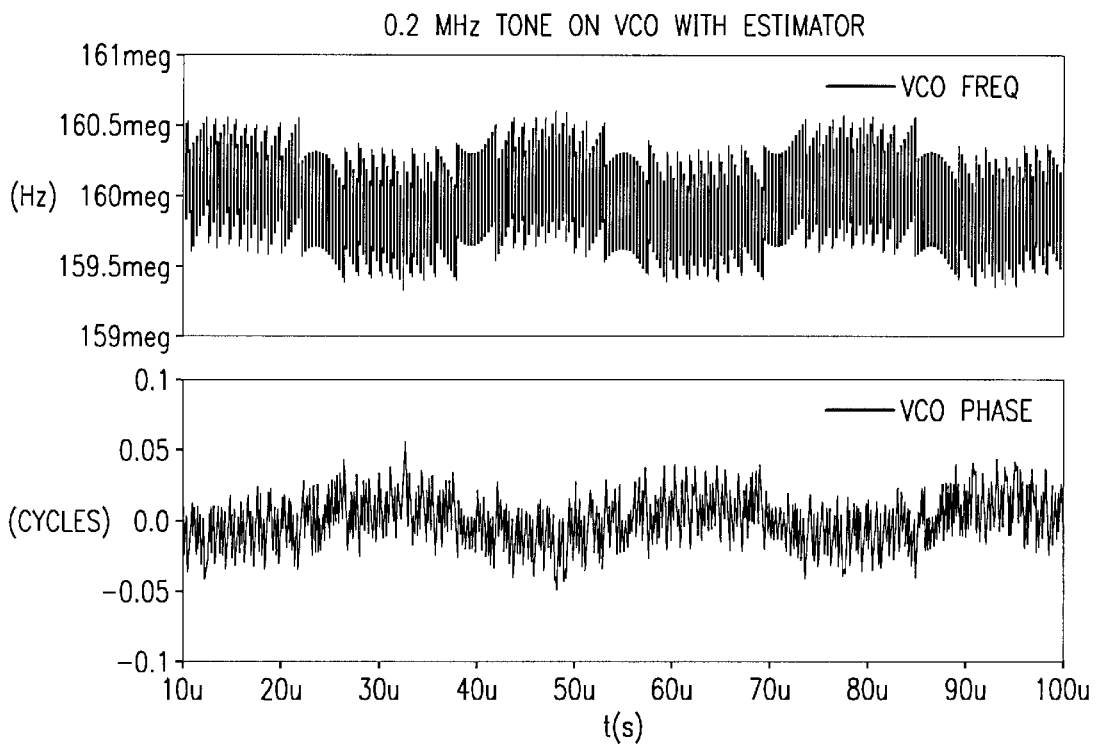
FIG. 24 is a simulation of the digital PLL with phase optimal frequency estimation having the VCO modulated with a 0.2 MHz tone.
Figure 25:
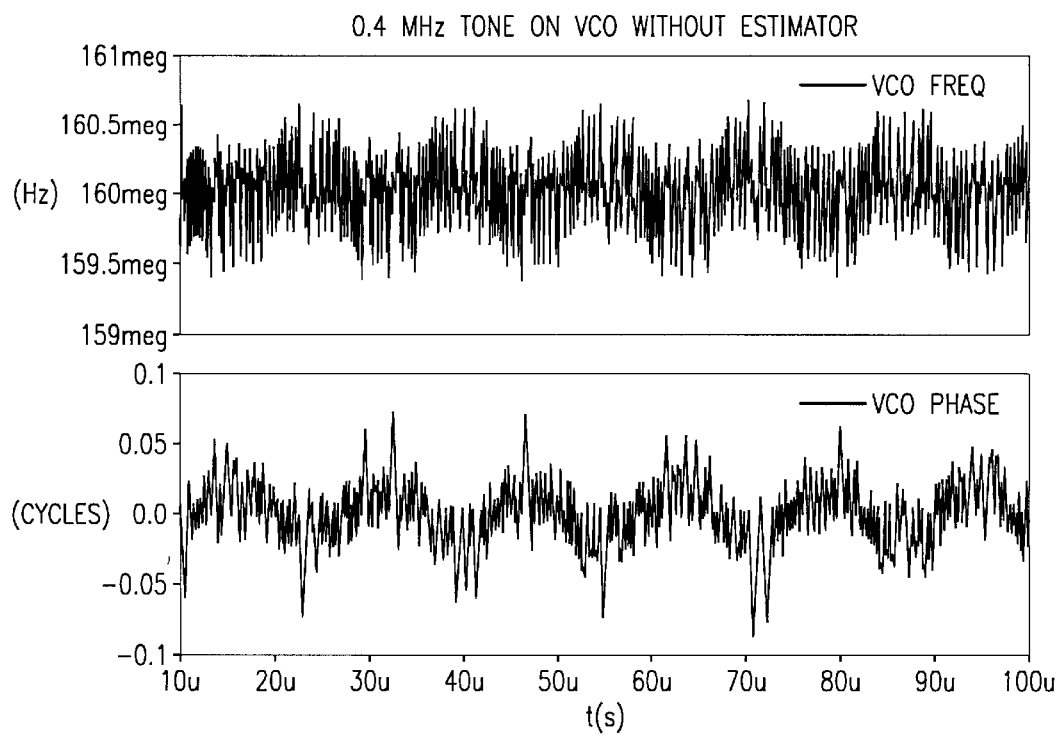
FIG. 25 is a simulation of the digital PLL without phase optimal frequency estimation having the VCO modulated with a 0.4 MHz tone.
Figure 26:
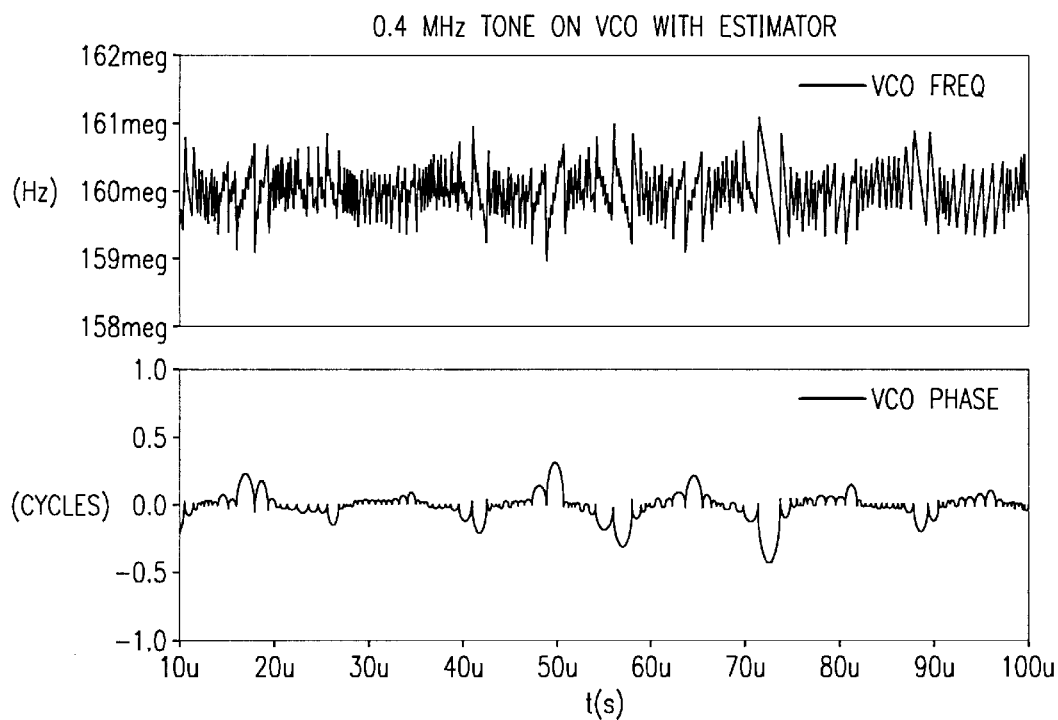
FIG. 26 is a simulation of the digital PLL with phase optimal frequency estimation having the VCO modulated with a 0.4 MHz tone.

The simulations of FIG. 23 and FIG. 24 show the effect of a low frequency tone of 0.2 MHz on the VCO without and with phase optimal frequency estimation, respectively. The VCO frequency and phase of FIG. 23 without the estimator are comparable to the VCO frequency and phase of FIG. 24 with the estimator. A comparison with the simulations of FIG. 25 and FIG. 26 at a higher VCO tone frequency of 0.4 MHz shows a divergence in the effect of the estimator. The estimator may even adversely impact loop performance at higher VCO tones. Thus, care must be exercised to avoid tones due to power supply ripple or other sources in the VCO. This may be accomplished by filtering techniques as are well known to those having ordinary skill in the art.

Although the invention has been described in detail with reference to its preferred embodiment, it is to be understood that this description is by way of example only and is not to be construed in a limiting sense. Various embodiments of the digital PLL of the present invention will be readily apparent to those of ordinary skill in the art having access to the instant specification. For example, a variable frequency oscillator (VFO) may be substituted for the VCO in any disclosed embodiments of the present invention. Furthermore, counter 69 need not have the same resolution as counter 70 (FIG. 8). Counter 69 may be a 6-bit counter that is initialized and reset to zero after each load signal on lead 68. Increment and decrement signals on leads 65 and 64, respectively, are applied at half the frequency of signals on leads 66 and 67 to produce a corrective positive or negative count. Counter 69 then applies this corrective positive or negative count to an adder included in counter 70 in response to a load signal on lead 68. In another embodiment of the present invention, increment and decrement signals on leads 66 and 67, respectively, may operate on the next to least significant bit of counter 70. These increment and decrement signals on leads 66 and 67 would replace corresponding increment and decrement signals on leads 65 and 64, respectively, and operate on the least significant bit of counter 69. This modified increment and decrement scheme would eliminate the need for blocks 115–118 (FIG. 10). Thus, return path 119 would originate with decision block 113.

Figure 27:
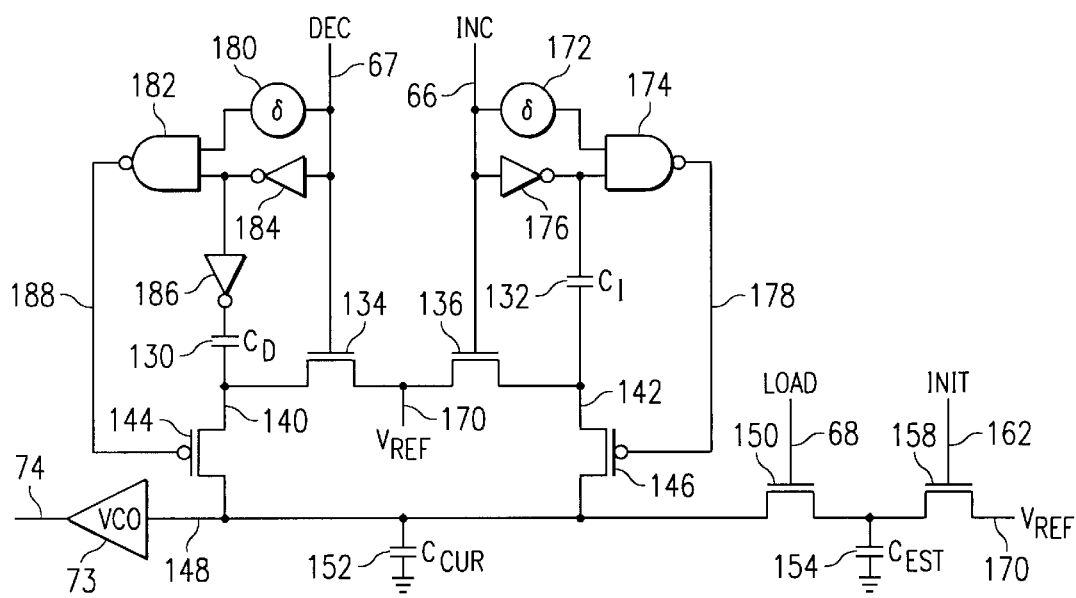
FIG. 27 is a schematic diagram of another embodiment of the digital PLL of the present invention with capacitors substituted for the current and estimate counters.

In yet another embodiment of the present invention, counters 69 and 70 may be replaced with capacitors. Moreover, the DAC in the VCO circuit 73 may be eliminated. Referring now to FIG. 27, capacitor $C_{CUR}$ 152 replaces counter 70 and capacitor $C_{EST}$ 154 replaces counter 69. The circuit is initialized when signals INIT on lead 162 and LOAD on lead 68 go high and precharge capacitors $C_{CUR}$ 152 and $C_{EST}$ 154 to reference voltage $V_{REF}$ 170 through transistors 150 and 158. Both signals INIT and LOAD return low and the VCO 73 produces a frequency on lead 74 determined by a voltage on capacitor $C_{CUR}$. A low-level increment pulse INC on lead 66 turns off precharge transistor 136. Inverter 176 produces a corresponding high-level pulse at an input of NAND gate 174. Both input terminals of NAND gate 174 remain high for a time established by delay circuit 172. Thus, NAND gate 174 produces a low-level pulse on lead 178 that turns on transistor 146. The high-level pulse from inverter 176 then pumps a charge packet on capacitor $C_1$ 132 through transistor 146 onto capacitor $C_{CUR}$ while the signal on lead 178 remains low. This charge packet increases the voltage on lead 148 and the frequency of the VCO. A high level on lead 178 after the time established by delay circuit 172 then turns off transistor 146. A subsequent high-level of increment pulse INC on lead 66 turns on precharge transistor 136. Inverter 176 produces a corresponding low level that precharges capacitor $C_1$ through precharge transistor 136 to reference voltage $V_{REF}$ 170. Each recurring increment pulse INC increases the voltage across capacitor $C_{CUR}$ and the VCO frequency. The resolution of this voltage increase is determined by a ratio of $C_1$ to $C_{CUR}$.

Figure 10:
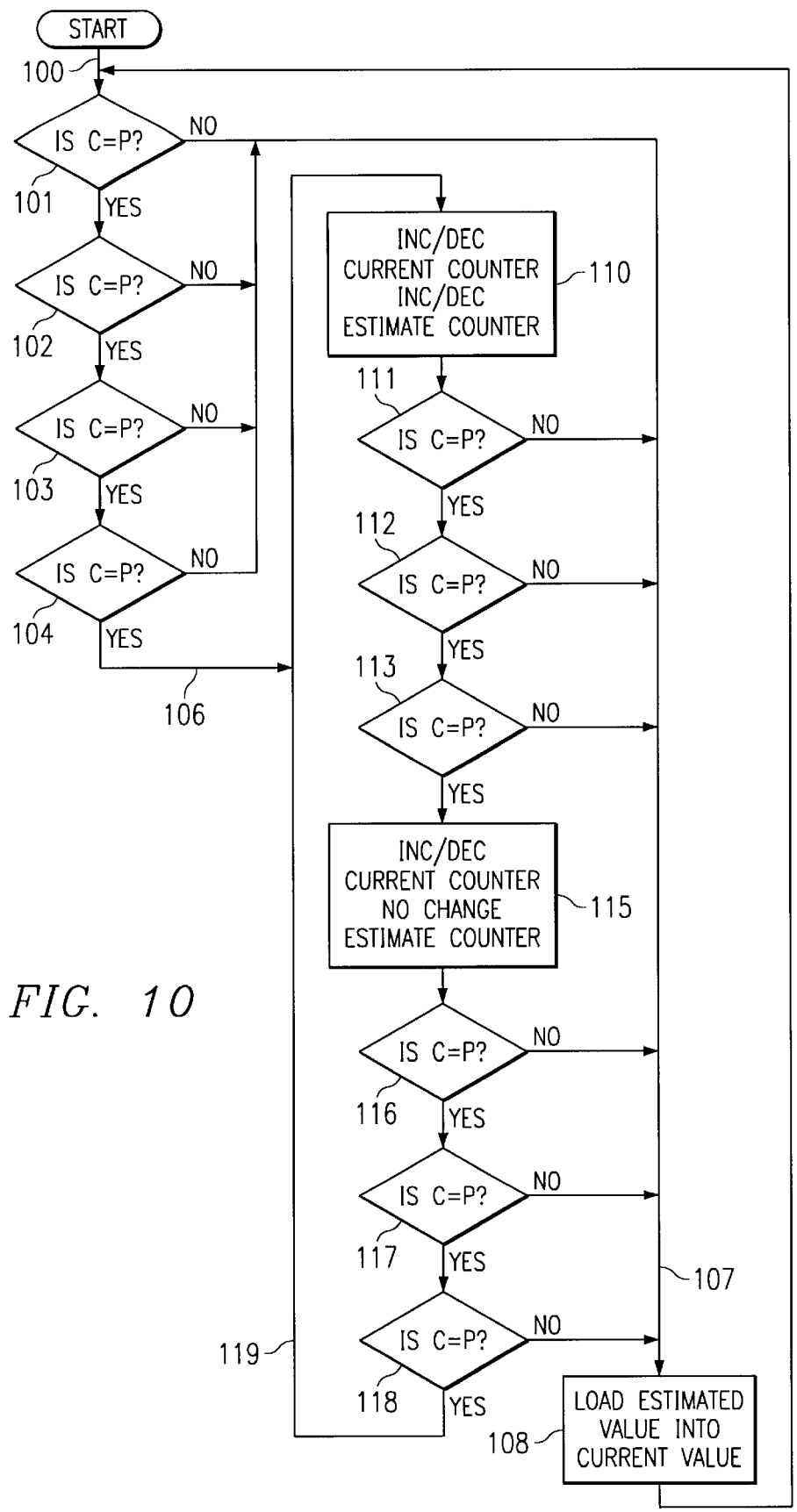
FIG. 10 is a flow chart of the digital PLL lock algorithm of the present invention.

A phase reversal eventually activates a load signal on lead 68 (block 108, FIG. 10). This load signal turns on transistor 150, thereby coupling capacitor $C_{CUR}$ to capacitor $C_{EST}$. Capacitors $C_{CUR}$ and $C_{EST}$ preferably have the same size. Thus, the capacitors are equalized to a voltage intermediate and preferably at a midpoint between the initial voltage on capacitor $C_{EST}$ and the current voltage of capacitor $C_{CUR}$. This intermediate voltage then serves as an initial voltage for capacitor $C_{EST}$ on a next estimate. This intermediate voltage also abruptly corrects the VCO frequency from point 121 to point 122 (FIG. 11) as previously described. In a similar manner, a low-level decrement pulse signal on lead 67 serves to extract a charge packet on capacitor $C_D$ via transistor 144, thereby reducing the voltage on capacitor $C_{CUR}$ and the VCO frequency. This modified increment and decrement scheme, therefore, would eliminate the need for blocks 110–113 (FIG. 10), since charge sharing between capacitor $C_{EST}$ and capacitors $C_{CUR}$ during a load operation precludes a need to increment a voltage on capacitor $C_{EST}$.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit, comprising:
a register circuit arranged to store a control word;
a variable frequency oscillator coupled to receive the control word, the variable frequency oscillator producing a clock signal having a current frequency corresponding to the control word;
a phase detector circuit coupled to receive a reference signal and the clock signal, the clock signal having one of a phase lead and a phase lag with respect to the reference signal, the phase detector circuit producing a phase signal having a first state in response to the phase lead and having a second state in response to the phase lag; and
an estimate circuit coupled to the register circuit and the phase detector circuit, the estate circuit producing a next control word to be stored in the register circuit, the next control word corresponding to a next frequency intermediate the current frequency and a frequency corresponding to a transition between the first and second states.

2. A circuit as in claim 1, wherein each of the register circuit and the estimate circuit further comprises a counter circuit.

3. A circuit as in claim 1, wherein the register circuit further comprises an adder circuit and wherein the estimate circuit produces the next control word by applying a correcting signal to the adder circuit.

4. A circuit as in claim 1, wherein:
a frequency of the reference signal is a quotient of an external reference signal frequency dividend and a first programmable divisor; and
a frequency of the clock signal is a quotient of to variable frequency oscillator frequency dividend and a second programmable divisor.

5. A circuit as in claim 4, wherein a frequency of said phase detector circuit producing a phase signal is determined by a ratio of the first programmable divisor to the second programmable divisor.

6. A circuit, comprising:
a register circuit arranged to store a control word;
a variable frequency oscillator coupled to receive the control word, the variable frequency oscillator producing a clock signal having a current frequency corresponding to the control word;
a phase detector circuit coupled to receive a reference signal and the clock signal, the lock signal having one of a phase lead and a phase lag with respect to the reference signal, the phase detector circuit producing a phase signal having a first state in response to the phase lead and having a second state in response to the phase lag, wherein the phase detector circuit further comprises a shift register circuit, the shift register circuit having plural stages each stage arranged to store a respective phase signal; and an estimate circuit coupled to the register circuit and the phase detector circuit, the estimate circuit producing a next control word to be stored in the register circuit.

7. A circuit as in claim 6, further comprising a control circuit coupled to receive each said respective phase signal of said plural stages, the control circuit arranged to increment the register circuit in response to one of the phase lead and the phase lag, the control circuit arranged to decrement the register circuit in response to another of the phase lead and the phase lag.

8. A circuit as in claim 7, wherein the control circuit produces a load signal in response to one of the phase lead and the phase lag in a first stage of said plural stages and another of the phase lead and the phase lag in a second stage of the of said plural stages.

9. A circuit, comprising:

a register circuit arranged to store a control word;

a variable frequency oscillator coupled to receive the control word, the variable frequency oscillator producing a clock signal having a current frequency corresponding to the control word;

a phase detector circuit coupled to receive a reference signal and the clock signal, the clock signal having one of a phase lead and a phase lag with respect to the reference signal, the phase detector circuit producing a phase signal having a first state in response to the phase lead and having a second state in response to the phase lag; and an estimate circuit coupled to the register circuit and the phase detector circuit, the estimate circuit producing a next control word to be stored in the register circuit, wherein a next frequency corresponds to the next control word, and wherein the next frequency is substantially half way between the current frequency and a frequency corresponding to a transition between the first and second states.

10. A circuit, comprising:

a storage device arranged to store a control signal;

a variable frequency oscillator coupled to receive the control signal, the variable frequency oscillator producing a clock signal having a current frequency commanding to the control signal;

a phase detector circuit coupled to receive a reference signal and the clock signal, the clock signal having one of a phase lead and a phase lag with respect to the reference signal, the phase detector circuit producing a phase signal having a first state in response to the phase lead and having a second state in response to the phase lag; and an estimate device coupled to the storage device and the phase detector circuit the estimate device producing a next control signal to be stored in the storage device, the next control signal corresponding to a next frequency intermediate the current frequency and a frequency corresponding to a transition between the first and second states.

11. A circuit as in claim 10, wherein:

a frequency of the reference signal is a quotient of an external reference signal frequency dividend and a first programmable divisor; and a frequency of the clock signal is a quotient of the variable frequency oscillator frequency dividend and a second programmable divisor.

12. A circuit as in claim 11, wherein a frequency of said phase detector circuit producing a phase signal is determined by a ratio of the first programmable divisor to the second programmable divisor.

13. A circuit, comprising:

a storage device arranged to store a control signal;

a variable frequency oscillator coupled to receive the control signal, the variable frequency oscillator producing a clock signal having a frequency corresponding to the control signal;

a phase detector circuit coupled to receive a reference signal and the clock signal, the clock signal having one of a phase lead and a phase lag with respect to the reference signal, the phase detector circuit producing a phase signal having a first state in response to the phase lead and having a second state in response to the phase lag; and an estimate device coupled to the storage device and the phase detector circuit, the estimate device producing a next control signal to be stored in the storage device, wherein each of the storage device and the storage device comprises a capacitor.

14. A circuit, comprising:

a storage device arranged to store a control signal;

a variable frequency oscillator coupled to receive the control signal, the variable frequency oscillator producing a clock signal having a current frequency corresponding to the control signal;

a phase or circuit coupled to receive a reference signal and the clock signal, the clock signal having one of a phase lead and a phase lag with respect to the reference signal, the phase detector circuit producing a phase signal having a first state in response to the phase lead and having a second state in response to the phase lag, wherein the phase detector circuit further comprises a shift register circuit, the shift register circuit having plural stages, each stage arranged to store a respective phase signal; and an estimate device coupled to the storage device and the phase detector circuit, the estimate device producing a next control signal to be stored in the storage device.

15. A circuit as in claim 14, further comprising a control circuit coupled to receive each said respective phase signal of said plural stages, the control circuit arranged to increment the control signal in response to one of the phase lead and the phase lag, the control circuit arranged to decrement the control signal in response to the other of the phase lead and the phase lag.

16. A circuit as in claim 15, wherein the control circuit produces a load signal in response to one of the phase lead and the phase lag in a first stage of said plural stages and another of the phase lead and the phase lag in a second stage of the of said plural stages, the control circuit coupling the storage device to the estimate device in response to the load signal.

17. A circuit, comprising:

a storage device arranged to store a control signal;

a variable frequency oscillator coupled to receive the control signal, the variable frequency oscillator producing a clock signal having a current frequency corresponding to the control signal;

a phase detector circuit coupled to receive a reference signal and the clock signal, the clock signal having one of a phase lead and a phase lag with respect to the reference signal, the phase detector circuit producing a phase signal having a first state in response to the phase lead and having a second state in response to the phase lag; and an estimate device coupled to the storage device and the phase detector circuit, the estimate device producing a next control signal to be stored in the storage device, wherein a next frequency corresponds to the next control signal, and wherein a next frequency is substantially half way between the current frequency and a frequency corresponding to a transition between the first and second states.

18. A method of estimating a frequency, comprising the steps of:

storing a control signal;

producing an oscillator signal having a frequency corresponding to a value of the control signal;

comparing a reference signal to the oscillator signal;

producing a phase signal in response to a phase transition between the reference signal and the oscillator signal;

producing a next control signal in response to the phase signal, the next control signal corresponding to a frequency intermediate the frequency corresponding to the value of the control signal and a frequency corresponding to the phase transition.

19. A method as in claim 18, further comprising the step of replacing the control signal with the next control signal.

20. A method as in claim 19, further comprising the step of producing a next oscillator signal having a frequency substantially half way between the frequency corresponding to the value of the control signal and the frequency corresponding to the phase transition in response to the next control signal.

21. A method as in claim 18, further comprising the steps of:

producing a sequence of phase signals; and storing each phase signal of the sequence in a respective stage of a shift register.

22. A method as in claim 21, further comprising the steps of:

comparing a first phase signal of the sequence of phase signals to a second phase signal of the sequence phase signals;

incrementing the control signal in response to one of a phase lead and a phase lag; and decrementing the control signal in response to another of the phase lead and the phase lag.

23. A method as in claim 18, further comprising the steps of:

producing a frequency of the reference signal by dividing an external reference signal frequency by a first programmable divisor; and producing a frequency of the clock signal by dividing the variable frequency oscillator frequency by a second programmable divisor.

24. A method as in claim 23, further comprising the step of sampling the phase signal at a rate determined by a ratio of the first programmable divisor to the second programmable divisor.

25. A method of estimating a frequency, comprising:

storing a first estimate signal;

storing a first control signal;

producing a first oscillator signal having a frequency corresponding to a value of the first control signal;

comparing a reference signal to the first oscillator signal;

producing a phase signal in response to the step of comparing;

storing a second control signal in response to the phase signal; and correcting the second control signal with the first estimate signal in response to a phase transition of the phase signal.

26. A method as in claim 25, comprising:

producing a second oscillator signal having a frequency corresponding to a value of the second control signal;

comparing the reference signal to the second oscillator signal;

detecting a phase transition in response to the step of comparing the reference signal to the second oscillator signal; and correcting the second control signal with the first estimate signal in response to the step of detecting.

27. A method as in claim 25, comprising storing a second estimate signal in response to the phase signal, wherein a difference between the first and second estimate signals is substantially half a difference between the first and second control signal.

28. A method as in claim 25, wherein the step of correcting the second control signal with the first estimate signal produces a second oscillator signal having a frequency between the frequency corresponding to the first control signal and a frequency corresponding to a previous phase transition of the phase signal.

29. A method as in claim 25, wherein the step of correcting the second control signal with the first estimate signal comprises replacing the second control signal with the first estimate signal.

30. A method as in claim 25, wherein the first control signal, the second control signal, and the first estimate signal are digital control words.

31. A method as in claim 27, wherein the first control signal, the second control signal, and the first estimate signal are voltage levels.

* * * * *